(12) United States Patent
Tripathi et al.

(10) Patent No.: US 9,230,802 B2
(45) Date of Patent: Jan. 5, 2016

(54) TRANSISTOR(S) WITH DIFFERENT SOURCE/DRAIN CHANNEL JUNCTION CHARACTERISTICS, AND METHODS OF FABRICATION

(71) Applicant: GLOBALFOUNDRIES Inc., Grand Cayman (KY)

(72) Inventors: Neeraj Tripathi, Albany, NY (US); Christopher Michael Prindle, Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 1 day.

(21) Appl. No.: 14/282,094

(22) Filed: May 20, 2014

(65) Prior Publication Data

US 2015/0340229 A1    Nov. 26, 2015

(51) Int. Cl.
*H01L 21/30* (2006.01)
*H01L 21/46* (2006.01)
*H01L 21/02* (2006.01)
*H01L 29/66* (2006.01)
*H01L 29/78* (2006.01)
*H01L 29/08* (2006.01)

(52) U.S. Cl.
CPC .... *H01L 21/02494* (2013.01); *H01L 21/02658* (2013.01); *H01L 29/0847* (2013.01); *H01L 29/66477* (2013.01); *H01L 29/78* (2013.01)

(58) Field of Classification Search
CPC . H01L 21/762; H01L 21/845; H01L 21/7607; H01L 21/78556; H01L 21/0228; H01L 21/02348; H01L 21/3141; H01L 21/0231; H01L 21/0214; H01L 21/7783; H01L 21/02642; H01L 27/1104; H01L 27/0922; H01L 27/203; H01L 27/3248; H01L 29/435; H01L 29/0649; H01L 29/66772; H01L 29/66045; H01L 51/4226
USPC ......... 438/456, 197, 199, 157, 158, 159, 222, 438/283, 311, 474, 513, 535, 602, 604, 603, 438/679, 680, 712, 743, 744, 769, 792; 257/E21.006, E21.014, E21.042, 257/E21.044, E21.051, E21.126, E21.127, 257/E21.134, E21.17, E21.329, E21.4, 257/E21.421, E21.227, E21.267, E21.279, 257/E21.293
See application file for complete search history.

(56) References Cited

U.S. PATENT DOCUMENTS 5,780,340 A * 7/1998 Gardner et al. ............... 438/259
5,796,143 A * 8/1998 Fulford et al. ................ 257/330

(Continued)

*Primary Examiner* — David Nhu
(74) *Attorney, Agent, or Firm* — Heslin Rothenberg Farley & Mesiti P.C.; Nicholas Mesiti, Esq.

(57) ABSTRACT

Field-effect transistors (FETs) and methods of fabricating field-effect transistors are provided, with one or both of a source cavity or a drain cavity having different channel junction characteristics. The methods include, for instance, recessing a semiconductor material to form a cavity adjacent to a channel region of the transistor, the recessing defining a bottom channel interface surface and a sidewall channel interface surface within the cavity; providing a protective liner over the sidewall channel interface surface, with the bottom channel interface surface being exposed within the cavity; processing the bottom channel interface surface to facilitate forming a first channel junction of the transistor; and removing the protective liner from over the sidewall channel interface surface, and subsequently processing the sidewall channel interface surface to form a second channel junction of the transistor, where the first and second channel junctions have different channel junction characteristics.

20 Claims, 3 Drawing Sheets

(56) References Cited

U.S. PATENT DOCUMENTS

| | | | |
|---|---|---|---|
| 5,874,341 A * | 2/1999 | Gardner et al. | 438/301 |
| 5,912,493 A * | 6/1999 | Gardner et al. | 257/344 |
| 6,005,272 A * | 12/1999 | Gardner et al. | 257/344 |
| 6,916,745 B2 * | 7/2005 | Herrick et al. | 438/700 |

* cited by examiner

TRANSISTOR(S) WITH DIFFERENT SOURCE/DRAIN CHANNEL JUNCTION CHARACTERISTICS, AND METHODS OF FABRICATION

FIELD OF THE INVENTION

The present invention relates to field-effect transistors (FETs), to semiconductor devices that include field-effect transistors, and to methods of forming field-effect transistors with engineered channel junctions at one or both of the source-to-channel interface or the drain-to-channel interface.

BACKGROUND OF THE INVENTION

Integrated circuits are formed from semiconductor substrates within and upon whose surfaces may be formed electrical circuit elements such as transistors including field-effect transistors (FETs). Conventionally, field-effect transistors have been fabricated as planar circuit elements.

Fin field-effect transistor (FinFET) devices are currently being developed to replace conventional planar transistors, such as metal oxide semiconductor field-effect transistors (MOSFETs), in advanced complementary metal oxide semiconductor (CMOS) technology, due to their improved short channel effect immunity and higher on-current to off-current ratio ($I_{on}/I_{off}$). As is known, the term "fin" refers to a vertical structure within or upon which are formed, for instance, one or more FinFETs or other fin devices, such as passive devices, including capacitors, diodes, etc.

As described by Moore's Law, the semiconductor industry drives down pattern dimensions in order to reduce transistor size and enhance processor speed at a rapid pace. Further enhancements in transistor designs and fabrication methods therefor continue to be pursued, for enhanced performance and commercial advantage.

BRIEF SUMMARY

The shortcomings of the prior art are overcome, and additional advantages are provided, through the provision, in one aspect, of a method, which includes: recessing a semiconductor material to form a cavity therein adjacent to a channel region of a transistor, the recessing defining a first channel interface surface and a second channel interface surface within the cavity; providing a protective liner over the second channel interface surface within the cavity, with the first channel interface surface being exposed within the cavity; processing the first channel interface surface to facilitate forming a first channel junction of the transistor at the first channel interface surface within the cavity; and removing the protective liner from over the second channel interface surface within the cavity, and processing the second channel interface surface to form a second channel junction of the transistor at the second channel interface surface within the cavity, where the first channel junction and the second channel junction include one or more different channel junction characteristics.

In a further aspect, a device is provided which includes a transistor. The transistor includes a source region and a drain region separated by a channel region, where the channel region resides within a semiconductor material. At least one of the source region or the drain region resides, at least partially, within a cavity in the semiconductor material, with the cavity including a first channel junction of the transistor at a bottom channel interface surface of the cavity, and a second channel junction of the transistor at a sidewall channel interface surface of the cavity, where the first channel junction and the second channel junction have one or more different channel junction characteristics.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Also note that reference is made below to the drawings, which are not drawn to scale for ease of understanding, wherein the same reference numbers used throughout different figures designate the same or similar components.

As noted above, with continual decreased scaling of transistors, even FinFETs, a challenge exists of reducing device-on-resistance, without increasing short channel effect (SCE) or punch-through current leakage. Undoped, embedded epi within the source and drain cavities may be one solution to the problem. Advantageously, such an approach allows for the source and drain regions to further include doped epitaxial material for lower source and drain sheet resistance, while the undoped buffer regions, for instance, at the bottom and sidewall surfaces of the source cavity and drain cavity, assist in increasing sharpness of the respective channel junctions, resulting in increased $L_{eff}$, and hence, a better short channel effect. Further, an undoped buffer region at the bottom surface of the source cavity and the bottom surface of the drain cavity reduces punch-through current, or source drain leakage. By way of example, FIGS. 1A-1C illustrate one embodiment of a process for fabricating a transistor, such as a field-effect transistor (FET), which includes embedded epi that defines enhanced channel junctions within the source cavity and within the drain cavity.

Figure 1A:
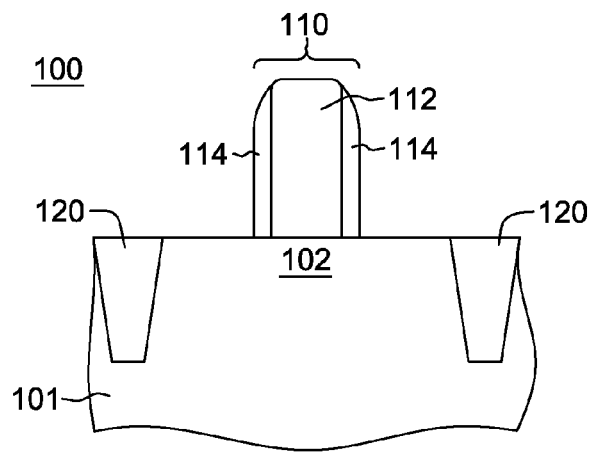
FIGS. 1A-1C depict one embodiment of a process for fabricating a field-effect transistor with enhanced first and second channel junctions at both of the source and drain regions, in accordance with one or more aspects of the present invention.
Figure 1B:
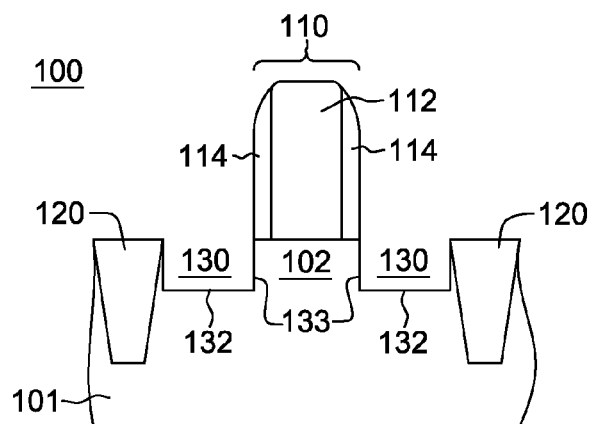
Figure 1C:
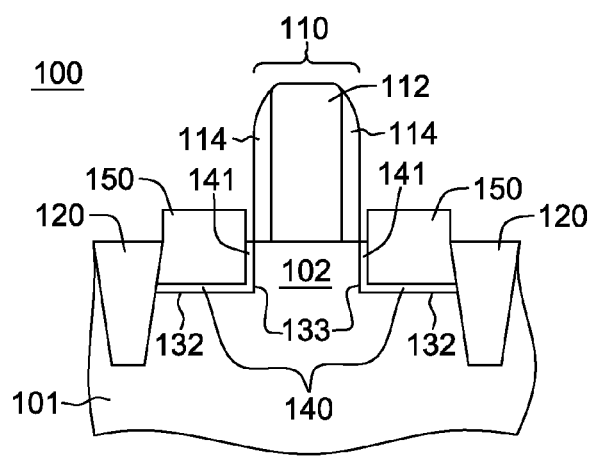

Referring to FIG. 1A, a cross-sectional elevational view is shown of a structure 100 obtained during one embodiment of a field-effect transistor fabrication process. In the illustrated example, a substrate 101, which may be a semiconductor substrate, is provided, along with a gate structure 110 overlying a channel region 102 within substrate 101. By way of example, gate structure 110 is depicted as a sacrificial gate structure for use in a gate-last process, in which gate structures are provided after establishment of the source region and the drain region of the transistor. In this embodiment, gate structure 110 includes, by way of example only, a sacrificial gate material 112 (such as polysilicon), and sidewall spacers 114 (formed, for example, from an oxide material). If desired, a gate cap (not shown) may be provided over sacrificial gate material 112. Note that in another embodiment, gate structure 110 could be a gate structure for a typical gate-first process, in which gate structures are provided before establishment of the source and drain regions of the field-effect transistor. In such a case, the sacrificial gate material would be replaced by one or more gate metals disposed above a gate dielectric, both of which may be surrounded by the sidewall spacers 114. An isolation region 120, such as shallow trench isolation, may at least partially surround the transistor, which may be, for instance, a planar field-effect transistor or a fin-type field-effect transistor.

By way of example, substrate 101 may be a bulk semiconductor material, such as a bulk silicon wafer. In another example, the substrate may be or include any silicon-containing substrate material including, but not limited to, single-crystal Si, polycrystalline Si, amorphous Si, Si-on-nothing (SON), Si-on-insulator (SOI), or Si-on-replacement insulator (SRI) substrates, and the like, and may be N-type or P-type doped, as desired for a particular application. In a further example, the substrate may be, for instance, a wafer or substrate approximately 600-700 micrometers thick, or less. The substrate may include other suitable elementary semiconductors, such as, for example, germanium (Ge), a crystal, or a compound semiconductor such as silicon carbide (SiC), gallium arsenide (GaAs), gallium phosphide (GaP), indium phosphide (InP), indium arsenide (InAs), and/or indium antimonide (InSb), or combinations thereof; or an alloy semiconductor including: GaAsP, AlInAs, GaInAs, GaInP, or GaIn-AsP, or combinations thereof. In another example, substrate 101 may include multiple layers of material.

In another embodiment, substrate 101 may include one or more three-dimensional fin structures, which extend from the substrate. In such a case, the gate structures may wrap up, over, and down the fin structure, so that a voltage may be applied to two or more surfaces of the fin structure, and in particular, to a channel region of the fin structure, allowing for a greater current to flow between a source region and a drain region during operation of the field-effect transistor.

As illustrated in FIG. 1B, substrate 101 is recessed adjacent to channel region 102 to form one or more cavities 130 therein, including, for instance, a source cavity and a drain cavity, separated by channel region 102, as illustrated. A variety of processing techniques may be employed to pattern substrate 101, and remove material thereof to form cavities 130. For example, substrate 101 may be patterned using direct lithography, sidewall image transfer techniques, extreme ultra-violet lithography (EUV), e-beam techniques, litho-etch techniques, or litho-etch-litho-freeze techniques. Removal may be accomplished using any suitable removal process, such as an etching process with an etchant selected to etch, for instance, the material of the substrate. In one example, the etching may be anisotropic etching, such as reactive ion etching (RIE), using an appropriate chemistry, depending on the material of the substrate. In a specific example, the reactive ion etching may be performed using fluorine-based chemistry, and gases such as tetrafluoromethane ($CF_4$), trifluoromethane ($CHF_3$), difluoromethane ($CH_2F_2$), fluoromethane ($CH_3F$), octofluoromethane ($C_4F_8$), hexafluoro-1,3-butadiene ($C_4F_6$), sulfur hexafluoride ($SF_6$), oxygen ($O_2$), and the like. In one implementation, cavities 130 may be box shaped with nearly perpendicular side walls. In another implementation, cavities 130 may have other shapes, and may have angular sidewalls. In one specific implementation, cavities 130 may be sigma cavities, which are named for the resemblance between the Greek-letter Σ (sigma) and the profile of its angular sidewall planes, which may include {111}, {110}, and/or {100} planes.

As illustrated in FIG. 1C, first and second channel junctions 140, 141 are next formed, in one embodiment, at the bottom and sidewall channel interface surfaces 132, 133, respectively, of cavities 130 (FIG. 1B). In one embodiment, the first and second channel junctions 140, 141 are formed as first and second channel buffer regions by, for instance, epitaxially growing the buffer regions from substrate 101 at the respective channel interface surfaces. By way of example, in the case of a p-type, field-effect transistor, the epitaxially grown channel buffer regions may be undoped silicon germanium-based epitaxy, and in the case of an n-type, field-effect transistor, the undoped buffer regions may be silicon-based epitaxy. As illustrated in FIG. 1C, the epitaxially grown channel buffer regions have similar thicknesses, with the thickness of the epitaxially grown buffers at both of the first and second channel junctions being determined by epi-growth characteristics. This is because the buffer regions, for instance, undoped buffer regions grow on the sidewall channel interface surface 133 and the bottom channel interface surface 132 at the same time, and therefore it is difficult to control relative thicknesses of the two regions separately. Note that epitaxial growth rates on the sidewall and bottom surfaces may be the same or different, depending, for instance, on epitaxial process conditions, and crystal orientations of the sidewall and bottom channel interface surfaces 132, 133. Note also that, in operation, the second channel junction 141 thickness acts as a high resistance path between the source, channel and drain, and hence desirably needs to be thinner, while the first channel junction 140 at the bottom channel interface surfaces should be sufficiently thick so as to minimize or avoid punch-through current between the source and drain at the bottom surfaces of the active transistor.

FIG. 1C also illustrates structure 100 after provision of a source region 150 and a drain region 150, at least partially, within the cavities 130 (FIG. 1B). In one embodiment, these source and drain regions may be respectively doped, epitaxially grown regions.

One challenge with the above-described approach to providing embedded epitaxy as undoped buffer regions in the source and drain cavities is that the undoped buffer grows on the channel sidewall at the same time that the buffer grows on the bottom of the source or drain cavity, and therefore, it is hard to separately control thicknesses at these two regions separately. The sidewall channel interface surface acts as a high-resistance path between the source, channel, and drain, and hence, should be thin to minimize device-on resistance, while the undoped buffer region at the bottom channel interface surface, that is, at the bottom of the source and drain cavities, should be relatively thick in order to avoid punch-through current between the source and drain from the bottom of the active transistor. FIGS. 2A-2F depict one embodiment of a transistor fabrication process which allows better, separate control of the first and second channel junction characteristics by allowing the junctions to be processed, at least partially, independently.

Before discussing the particular process of FIGS. 2A-2F, however, generally stated, methods are provided herein for fabricating field-effect transistors (FETs) with one or both of the source cavity and drain cavity having different channel junction characteristics. The method includes, for instance, recessing a semiconductor material to form a cavity therein adjacent to a channel region of the transistor, the recessing defining a first channel interface surface and a second channel interface surface within the cavity; providing a protective liner over the second channel interface surface within the cavity, with the first channel interface surface being exposed within the cavity; processing the first channel interface surface to facilitate forming a first channel junction of the transistor at the first channel interface surface within the cavity; and removing the protective liner from over the second channel interface surface, and processing the second channel interface surface to form a second channel junction of the transistor at the second channel interface surface within the cavity, where the first channel junction and the second channel junction include one or more different channel junction characteristics.

By way of example, processing the first channel interface surface within the cavity may facilitate forming a first channel buffer region, and processing the second channel interface surface within the cavity may include forming a second channel buffer region within the cavity. For example, processing the first channel interface surface within the cavity may include epitaxially growing at least a first portion of the first buffer channel within the cavity, and processing the second channel interface surface within the cavity may include epitaxially growing the second channel buffer region within the cavity. In one embodiment, processing the second channel interface surface within the cavity further includes epitaxially growing a second portion of the first channel buffer region over the first portion thereof at the first channel interface surface commensurate with the epitaxially growing of the second channel buffer region. Thus, the first channel buffer region and the second channel buffer region may have different thicknesses, and if desired, the first and second channel buffer regions may have one or more different epitaxial material characteristics. For instance, one of the channel regions may be doped, while the other undoped, or the channel regions may be differently-doped with, for instance, different dopants or different concentrations of a same or different dopant being provided. Note that in one embodiment, after proving the protective liner over the second channel interface surface, the first channel interface surface (e.g., the bottom channel interface surface) within the cavity may be further recessed into the substrate to accommodate the epitaxial growing of the first portion of the first buffer channel region within the cavity, without overlying the protective liner over the second channel interface surface.

In another implementation, processing the first channel interface surface within the cavity may include performing a first implant of the first channel interface surface within the cavity to facilitate forming the first channel junction, and processing the second channel interface surface within the cavity may include performing a second implant of the second channel interface surface to form the second channel junction of the transistor. In accordance with one embodiment, processing the second channel interface surface with the second implant may further include also processing the first channel interface surface with the second implant. In this manner, different dopants or different concentrations of dopants may be provided at the first and second channel interface surfaces in order to form one or more different characteristics for the first and second channel junctions within a respective cavity, sized and positioned to accommodate, at least in part, the source region or the drain region of the transistor. Note further, if desired, in addition to having different junction characteristics within a given cavity, the source and drain region cavities may themselves have different junction characteristics depending, for instance, on the desired transistor characteristics.

In another aspect, a device is disclosed which includes a transistor, such as a field-effect transistor (FET), with a source region and a drain region separated by a channel region. The channel region resides within a semiconductor material, and at least one of the source region or the drain region resides, at least partially, within a cavity in the semiconductor material, with the cavity including a first channel junction of the transistor at a bottom channel interface surface of the cavity, and a second channel junction of the transistor at sidewall channel interface surface of the cavity, where the first and second channel junctions have one or more different channel junction characteristics.

Figure 2A:
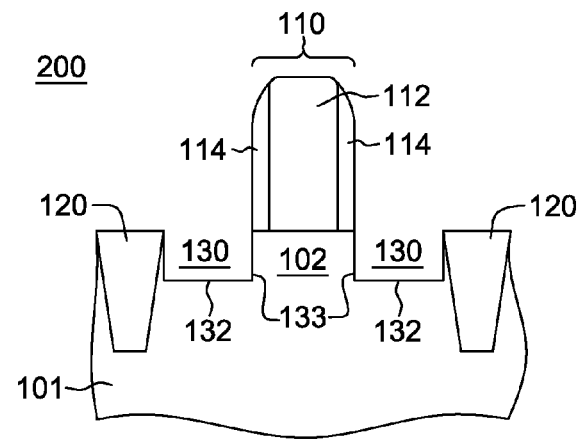
FIG. 2A is a cross-sectional elevational view of a structure obtained during another transistor fabrication process, in accordance with one or more aspects of the present invention.

Referring to FIG. 2A, a structure 200 is illustrated similar or identical to structure 100 of FIG. 1B of the above-described processing flow. Briefly, structure 200 includes substrate 101, along with gate structure 110 overlying channel region 102 within substrate 101. In this example, gate structure 110 includes sacrificial gate material 112 and sidewall spacers 114, as described above. As noted, substrate 101 may be or include a semiconductor material, such as described above in connection with FIGS. 1A-1C. Substrate 101 is recessed adjacent to channel region 102 to form one or more cavities 130 therein, including, for instance, a source cavity and a drain cavity, separated by channel region 102, as illustrated. Isolation region 120, such as shallow trench isolation, at least partially surrounds the transistor, which as noted, may be a planar field-effect transistor or a fin-type, field-effect transistor. At the processing stage of FIG. 2A, the bottom channel interface surfaces 132 and sidewall channel interface surfaces 133 of cavities 130 are exposed. Note that cavities 130 may have been patterned and etched as described above in connection with FIGS. 1A-1C.

Figure 2B:
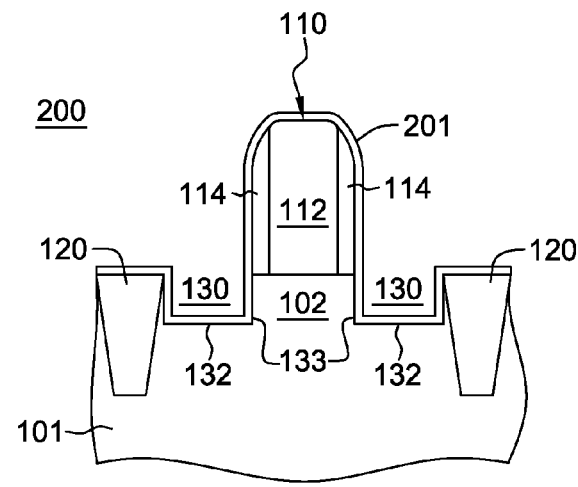
FIG. 2B depicts the structure of FIG. 2A, after providing a protective liner within the source and drain cavities, in accordance with one or more aspects of the present invention.

As illustrated in FIG. 2B, a thin protective liner 201 is conformally applied over structure 200, including over bottom channel interface surfaces 132 within cavities 130, as well as over sidewall channel interface surfaces 133 within cavities 130. By way of example, protective liner 201 may be one of various materials, provided the buffer region growth or deposition (in the case of epitaxy) is selective between the substrate and liner materials. In one embodiment, the protective liner is a nitride liner or an oxide liner, and may have a thickness of, for instance, about 2 to 7 nanometers in a FinFET fabrication process, or up to 10 nanometers or more nanometers for a planar transistor fabrication process. For example, protective liner 201 may be or include a nitride liner such as, for instance, silicon nitride ($Si_3N_4$ or SiN) or silicon oxynitride (SiON), which may be deposited using any conventional deposition processes, such as chemical vapor deposition (CVD), physical vapor deposition (PVD), atomic layer deposition (ALD), or plasma-enhanced versions of such processes. In another example, protective liner 201 may also be or include an oxide liner such as, for instance, silicon oxide ($SiO_2$) or plasma-enhanced silicon oxide.

Figure 2C:
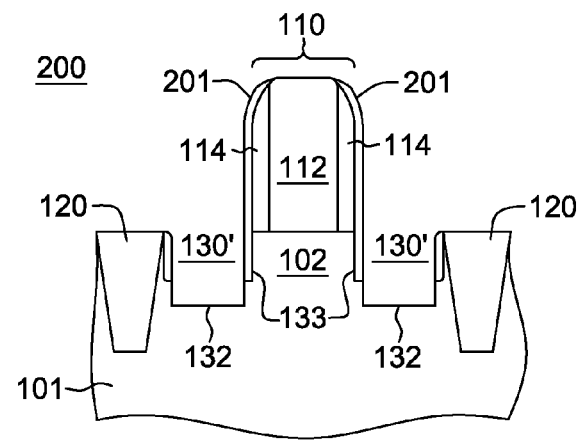
FIG. 2C depicts the structure of FIG. 2B, after partially removing the protective liner within the source and drain cavities, and further etching the semiconductor material to expand the source and drain cavities at the bottom channel interface surfaces, in accordance with one or more aspects of the present invention.
Figure 2D:
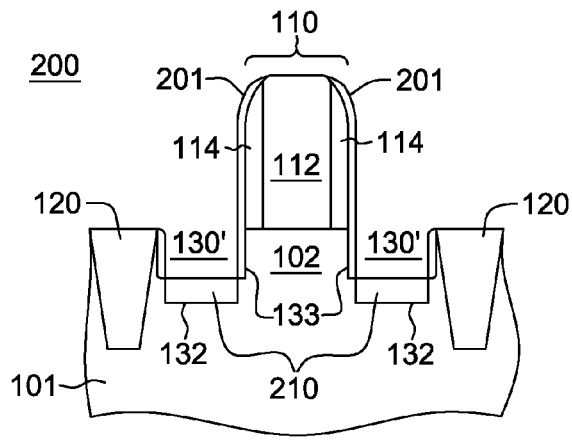
FIG. 2D depicts the structure of FIG. 2C, after one embodiment of processing the exposed bottom channel interface surfaces within the source and drain cavities to facilitate forming first channel junctions of the transistor at the bottom channel interface surfaces, in accordance with one or more aspects of the present invention.

In FIG. 2C, protective liner 201 has been anisotropically etched to expose bottom channel interface surfaces 132 of the cavities, and as noted, further recessing of substrate 101 has been performed to extend cavities 130' below the protective liner 201 over sidewall channel interface surfaces 133. This further recessing may be performed using a variety of techniques to pattern substrate 101 and remove the additional material thereof to form the extended cavities 130'. For example, the above-described patterning and etching processes used to obtain the structure of FIG. 1B may be repeated at this step to further recess the semiconductor material and recess the cavities 130' into substrate 101. The further recessing of the source and drain cavities is provided so that, as illustrated in FIG. 2D, a first epitaxial growth at the exposed bottom channel interface surfaces 132 to produce a first portion 210 of a first channel buffer region 221 (FIG. 2F) may occur without the buffer region extending over protective liner 201 covering sidewall channel interface surfaces 133. In one implementation, first portion 210 of the first channel buffer regions within the respective cavities may be a relatively thick, undoped epitaxial buffer growth, for instance, in a rage of about 2 nm to 100 nm. In an alternative implementation, the epitaxially grown first portion 210 of the first channel buffer regions in the bottom portions of the cavities could be doped, if desired.

Figure 2E:
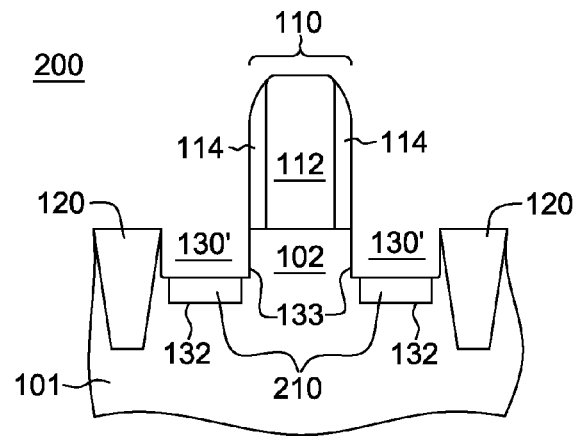
FIG. 2E depicts the structure of FIG. 2D, after removal of the protective liner from over the sidewall channel interface surfaces in the source and drain cavities, in accordance with one or more aspects of the present invention.
Figure 2F:
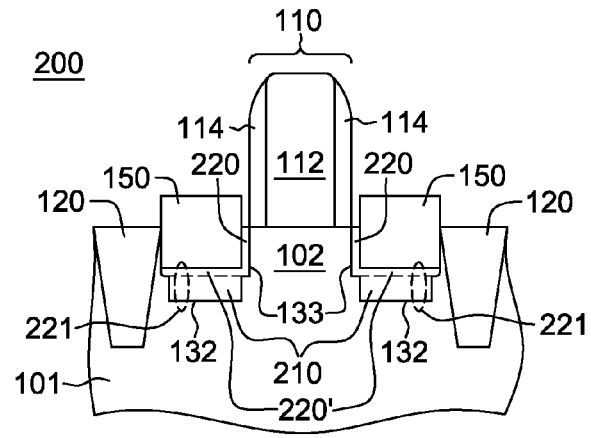
FIG. 2F depicts the structure of FIG. 2E, after one embodiment of subsequent processing of the sidewall channel interface surfaces within the source and drain cavities to form second channel junctions of the transistors at the sidewall channel interface surfaces, and after provision of source and drain regions at least partially within the source and drain cavities, respectively, in accordance with one or more aspects of the present invention.

In FIG. 2E, protective liner 201 (FIG. 2D) is removed from the sidewall channel interface surfaces 133 using, for instance, a timed etch process selective to the protective liner material, such as a nitride etch in the example of a nitride liner. As shown in FIG. 2F, a second epitaxial growth is performed to, for instance, grow a thin undoped buffer 220 over sidewall channel interface surfaces 133, which also forms a second portion 220' of the first channel buffer region 221 over bottom channel interface surfaces 132 of the cavities. In the depicted implementation, the first channel buffer region 221 including first buffer portion 210 and second buffer portion 220' has a greater thickness than the second channel buffer region 220 over sidewall channel interface surfaces 133, having principally been formed from two different growth processes. Note also, the first and second channel buffer regions 221, 220 could include one or more different epitaxial material characteristics. For instance, besides different thicknesses, the regions could be differently doped. After provisions of the first and second channel buffer regions, source and drain regions 150 may be provided within the respective source and drain cavities, for instance, by doped epitaxial growth within the cavities. Alternatively, the second epitaxial growth could be performed to produce the source and drain regions 150 as well in a single process step.

Note that the fabrication process of FIGS. 2A-2F could be employed to produce other types of first and second channel junctions with one or more different channel junction characteristics within a source and/or drain cavity, or between source or drain cavities. For instance, the processing described above could be employed to treat the bottom channel interface surface of the source and drain cavity differently from the sidewall channel interface surface, such as, by implanting only the bottom channel interface surface, without affecting the sidewall channel interface surface, or by differently implanting the bottom and sidewall channel interface surfaces of the cavity, for instance, with different concentrations of a dopant.

Advantageously, the fabrication processing of FIGS. 2A-2F allows for separate, essentially independent processing of the bottom and sidewall channel interface surfaces to, for instance, provide the bottom and sidewall channel interface surfaces one or more different epitaxial growth characteristics, or to otherwise separately treat the bottom and sidewall channel interface surfaces, such as by separately implanting the surfaces. In so doing, the bottom and sidewall channel junction profiles are separately controllable and therefore may be tailored to achieve, for instance, fabrication of a transistor with reduced device on resistance, that is, reduced resistance at the sidewall channel junctions, at minimal or no increased short channel effect loss, due, for instance, to the separate processing of the bottom channel junctions from the sidewall channel junctions.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method of fabricating field effect transistors (FETs), the method comprising:
recessing a semiconductor material to form a cavity therein adjacent to a channel region of a transistor, the recessing defining a first channel interface surface and a second channel interface surface within the cavity;
providing a protective liner over the second channel interface surface within the cavity, with the first channel interface surface being exposed within the cavity;
processing the first channel interface surface to facilitate forming a first channel junction of the transistor at the first channel interface surface within the cavity; and
removing the protective liner from over the second channel interface surface, and processing the second channel interface surface to form a second channel junction of the transistor at the second channel interface surface within the cavity, wherein the first channel junction of the transistor and the second channel junction of the transistor comprise one or more different channel junction characteristics.

2. The method of claim 1, wherein processing the first channel interface surface within the cavity facilitates forming a first channel buffer region, and processing the second channel interface surface within the cavity comprises forming a second channel buffer region within the cavity.

3. The method of claim 2, wherein processing the first channel interface surface within the cavity comprises epitaxially growing at least a first portion of the first buffer channel region within the cavity, and wherein processing the second channel interface surface within the cavity comprises epitaxially growing the second channel buffer region within the cavity.

4. The method of claim 3, wherein processing the second channel interface surface within the cavity further comprises epitaxially growing a second portion of the first channel buffer region over the first portion thereof at the first channel interface surface commensurate with epitaxially growing the second channel buffer region.

5. The method of claim 4, wherein the first channel buffer region and the second channel buffer region have different thicknesses.

6. The method claim 4, wherein the first channel buffer region and the second channel buffer region comprise one or more different epitaxial material characteristics.

7. The method of claim 3, further comprising, after the providing the protective liner over the second channel interface surface, further recessing the first channel interface surface within the cavity to accommodate the epitaxial growing of the first portion of the first buffer channel region within the cavity without overlying the protective liner.

8. The method of claim 1, wherein processing the first channel interface surface within the cavity comprises performing a first implant of the first channel interface surface within the cavity to facilitate forming the first channel junction of the transistor, and processing the second channel interface surface within the cavity comprises performing a second implant of the second channel interface surface to form the second channel junction of the transistor.

9. The method of claim 8, wherein performing the second implant also comprises further implanting the first channel interface surface to form the first channel junction of the transistor from the first implant and the second implant.

10. The method of claim 1, wherein the first channel interface surface comprises a bottom channel interface surface within the cavity, and the second channel interface surface comprises a sidewall channel interface surface within the cavity.

11. The method of claim 1, further comprising forming one of a source region or a drain region within, at least partially, the cavity subsequent to forming of the first and second channel junctions therein.

12. The method of claim 1, wherein the protective liner over the second channel interface surface comprises at least one of a nitride or an oxide liner.

13. The method of claim 1, wherein the cavity comprises a first cavity, and the recessing of the semiconductor material further comprises forming a second cavity therein adjacent to the channel region of the transistor, and wherein the first channel interface surface comprises a bottom channel interface surface within the first cavity, and the second channel interface surface comprises a sidewall channel interface surface within the first cavity, and wherein the method further comprises:
providing the protective liner over a sidewall channel interface surface within the second cavity, with a bottom channel interface surface within the second cavity being exposed;
simultaneously processing the bottom channel interface surfaces within the first and second cavities to facilitate forming first channel junctions of the transistor within the first and second cavities at the bottom channel interface surfaces thereof;
removing the protective liner from over the sidewall channel interface surfaces within the first and second cavities, and subsequently, simultaneously processing the sidewall channel interface surfaces within the first and second cavities to facilitate forming the second channel junctions of the transistor at the sidewall channel interface surfaces of the first and second cavities, wherein the first channel junction and the second channel junction within each cavity of the first and second cavities comprise different channel junction characteristics; and
forming a source region of the transistor at least partially within the first cavity, and a drain region of the transistor at least partially within the second cavity.

14. A device comprising:
a transistor, the transistor comprising:
a source region and a drain region separated by a channel region, the channel region residing within a semiconductor material; and
wherein at least one of the source region or the drain region resides, at least partially, within a cavity in the semiconductor material, with the cavity comprising a first channel junction of the transistor at a bottom channel interface surface of the cavity, and a second channel junction of the transistor at a sidewall channel interface surface of the cavity, wherein the first channel junction of the transistor and the second channel junction of the transistor comprise one or more different channel junction characteristics.

15. The device of claim 14, wherein the source region and the drain region each reside, at least partially, within a respective cavity in the semiconductor material, and wherein the respective cavity comprises the first channel junction of the transistor at the bottom channel interface surface, and the second channel junction of the transistor at the sidewall channel interface surface, the first channel junction and the second channel junction of the respective cavity comprising different channel junction characteristics.

16. The device of claim 14, wherein the first channel junction comprises a first channel buffer region, and the second channel junction comprises a second channel buffer region.

17. The device of claim 16, wherein the first channel buffer region and the second channel buffer region are differently-doped channel buffer regions.

18. The device of claim 16, wherein the first channel buffer region and the second channel buffer region have different thicknesses.

19. The device of claim 16, wherein the first channel buffer region is thicker than the second channel buffer region and recessed at least partially into the semiconductor material.

20. The device of claim 14, wherein the first channel junction and the second channel junction comprise one or more different implant characteristics.

* * * * *